United States Patent
Dent et al.

(10) Patent No.: US 10,662,956 B2
(45) Date of Patent: May 26, 2020

(54) FAN DEVICE

(71) Applicant: STEGO-Holding GmbH, Schwäbisch Hall (DE)

(72) Inventors: Robert Dent, Schwäbisch Hall (DE); Bernd Armin Schanzenbach, Mainhardt (DE); Elmar Mangold, Unterschneidheim (DE)

(73) Assignee: STEGO-HOLDING GMBH, Schwäbisch Hall (DE)

( * ) Notice: Subject to any disclaimer, the term of this patent is extended or adjusted under 35 U.S.C. 154(b) by 481 days.

(21) Appl. No.: 15/024,703

(22) PCT Filed: Sep. 24, 2014

(86) PCT No.: PCT/EP2014/070366
§ 371 (c)(1),
(2) Date: Mar. 24, 2016

(87) PCT Pub. No.: WO2015/044198
PCT Pub. Date: Apr. 2, 2015

(65) Prior Publication Data
US 2016/0230770 A1    Aug. 11, 2016

(30) Foreign Application Priority Data
Sep. 25, 2013  (DE) .................. 10 2013 015 985

(51) Int. Cl.
*F04D 25/12* (2006.01)
*F04D 29/52* (2006.01)
*F04D 29/64* (2006.01)

(52) U.S. Cl.
CPC ........... *F04D 25/12* (2013.01); *F04D 29/522* (2013.01); *F04D 29/644* (2013.01)

(58) Field of Classification Search
CPC ..... G01N 1/04; B01J 20/267; B01J 20/28011; B01J 20/28016; B01J 2220/68;
(Continued)

(56) References Cited

U.S. PATENT DOCUMENTS 2,775,010 A    12/1956   Bedford, Jr.
4,353,680 A *  10/1982   Hiraoka ................ F04D 29/646
                                                                415/201
(Continued)

FOREIGN PATENT DOCUMENTS

CN    102939804 A    2/2013
DE    195 25 850 C1  8/1996
(Continued)

OTHER PUBLICATIONS

Office Action dated Aug. 3, 2017 issued by Chinese Intellectual Property Office in parallel Chinese Patent Application No. 201480051465.8, partial machine translation provided.
(Continued)

*Primary Examiner* — William M McCalister
(74) *Attorney, Agent, or Firm* — Hassan Abbas Shakir; Shakir Law PLLC

(57) ABSTRACT

The invention relates to a fan device with at least one locking element for securing the fan device to a wall portion, in particular to an electrical enclosure wall, with a front and a rear face. The fan device is inserted into a front-face wall portion opening in a pressureless manner, and the locking element is movable in the direction of the rear face of the wall portion in the inserted state.

17 Claims, 3 Drawing Sheets

(58) Field of Classification Search
CPC ... B65B 1/06; B65B 1/22; F04D 25/12; F04D 29/522; F04D 29/644
USPC ....................................................... 415/213.1
See application file for complete search history.

(56) References Cited

U.S. PATENT DOCUMENTS

| | | | | |
|---|---|---|---|---|
| 4,834,615 | A * | 5/1989 | Mauch | F24F 13/32 |
| | | | | 415/213.1 |
| 5,567,200 | A * | 10/1996 | Swartzendruber | A01K 1/0052 |
| | | | | 454/338 |
| 5,575,622 | A * | 11/1996 | Zimmerman | F04D 29/703 |
| | | | | 415/213.1 |
| 5,788,566 | A | 8/1998 | McAnally et al. | |
| 5,931,979 | A | 8/1999 | Immel | |
| 6,077,037 | A * | 6/2000 | Schmidt | F04D 29/601 |
| | | | | 24/546 |
| 6,213,819 | B1 | 4/2001 | Fan | |
| 6,979,169 | B2 * | 12/2005 | Penlesky | F04D 29/4226 |
| | | | | 415/1 |
| 7,301,768 | B2 * | 11/2007 | Fan | H05K 7/20172 |
| | | | | 16/422 |
| 8,444,373 | B2 * | 5/2013 | Tang | F04D 25/166 |
| | | | | 361/695 |
| 8,961,126 | B1 * | 2/2015 | Tom | F24F 13/078 |
| | | | | 362/368 |
| 9,157,453 | B2 * | 10/2015 | Wenger | F04D 25/08 |
| 2008/0318515 | A1 * | 12/2008 | Yeung | F04D 29/4206 |
| | | | | 454/354 |
| 2012/0274094 | A1 | 11/2012 | Mazur et al. | |
| 2013/0033159 | A1 | 2/2013 | Immel | |
| 2013/0067875 | A1 | 3/2013 | Hartmann et al. | |
| 2013/0129499 | A1 * | 5/2013 | Michaud | F01D 25/24 |
| | | | | 415/213.1 |
| 2013/0221186 | A1 | 8/2013 | Sun | |
| 2013/0272869 | A1 * | 10/2013 | Fu | F04D 29/601 |
| | | | | 415/213.1 |
| 2013/0315728 | A1 * | 11/2013 | Zhou | G06F 1/183 |
| | | | | 415/213.1 |
| 2015/0086354 | A1 * | 3/2015 | Weng | F04D 29/422 |
| | | | | 415/213.1 |
| 2015/0125292 | A1 * | 5/2015 | Karst | F04D 25/166 |
| | | | | 415/213.1 |
| 2015/0252812 | A1 * | 9/2015 | Sauer | F04D 25/08 |
| | | | | 417/423.14 |
| 2015/0252818 | A1 * | 9/2015 | Heli | F04D 29/646 |
| | | | | 415/213.1 |
| 2015/0308455 | A1 * | 10/2015 | Heli | F04D 19/002 |
| | | | | 415/177 |

FOREIGN PATENT DOCUMENTS

| | | |
|---|---|---|
| DE | 19607590 A1 | 8/1996 |
| DE | 200 06 849 U1 | 8/2000 |
| DE | 102007004018 A1 | 7/2008 |
| DE | 102010000198 A1 | 7/2011 |
| DE | 102010016504 A1 | 10/2011 |
| EP | 2042010 B1 | 9/2009 |
| JP | 46-33627 | 11/1971 |
| JP | S48102466 | 12/1973 |
| JP | S516707 U | 1/1976 |
| JP | S54120984 A | 9/1979 |
| JP | S61-58925 | 12/1986 |
| JP | H03-033206 | 4/1991 |
| JP | H0727389 A | 1/1995 |
| JP | H0763388 A | 3/1995 |
| JP | H0942733 A | 2/1997 |
| JP | 2009063211 A | 3/2009 |
| RU | 2352825 C1 | 4/2009 |
| WO | 2008001396 A1 | 1/2008 |

OTHER PUBLICATIONS

German Patent Office office action dated May 16, 2014 for corresponding application DE 10 2013 015 985.7, Partial Machine translation provided.
International Search Report dated Jan. 15, 2015 in priority application PCT/EP2014/070366, English version also provided.
Written Opinion dated Apr. 2, 2015 in priority application PCT/EP2014/070366, partial machine translation provided.
Office Action dated May 8, 2018 and issued by the Japanese Patent Office in Japanese patent application 2016-516876, partial translation provided.
Office Action dated Mar. 30, 2018 with regard to the parallel Russian Patent Application No. 2016115796, partial machine translation provided.
Official Translation of Written Opinion dated Apr. 2, 2015 in priority application PCT/EP2014/070366.
Office Action dated Dec. 18, 2018 and issued by the Japanese Patent Office in related Japanese Patent Application 2016-516876, English translation provided.
Office Action dated Aug. 20, 2019 issued by the Japanese Patent Office in related Japanese Patent Application No. 2016-516876, English translation provided.
Decision of Refusal dated Dec. 3, 2019 issued by the Japanese Patent Office in related Japanese Patent Application 2016-516876, English translation provided.
Decision of Dismissal of an Amendment dated Dec. 3, 2019 issued by the Japanese Patent Office in related Japanese Patent Application 2016-516876, English translation provided.

* cited by examiner

FAN DEVICE

BACKGROUND OF THE INVENTION

1. Field of the Invention

The invention relates to a fan device having at least one locking element for fastening the fan device on a wall portion, which comprises a front side and a rear side, in particular on a wall of a switching cabinet, and to such a locking element.

2. Discussion of the Related Art

Fan devices of the type addressed here are known in principle. They include a fan carrier and a fan which is held by the fan carrier. These types of fan devices are provided for fastening on a switching cabinet and serve for ventilating said switching cabinet. To this end, cold air is sucked in by means of the fan via a filter mat which is connected upstream of the fan and is pressed out again via an output filter mat which is connected higher up in the switching cabinet. The fastening of the known fan devices on the switching cabinet is effected, as a rule, in such a manner that the fan device is inserted into a suitable recess admitted into the wall of the switching cabinet. The locking between the fan device and the wall of the switching cabinet is effected, in this case, in such a manner that the fan device is pressed at a considerable pressure in the insertion direction into the recess until a latching element fastened on the fan device has passed the wall of the switching cabinet and latches behind said wall. Said solution is tainted with disadvantages insofar as the cabinet wall can become severely bent as a result of the pressure exerted whilst the fan device is being fastened, in particular when the cabinet wall is curved. This results in gaps between the wall of the switching cabinet and the fan device which have to be offset with a foamed-on seal.

SUMMARY OF THE INVENTION

Consequently, it is the object of the present invention to create a fan device and a locking element which avoid the cabinet wall becoming deformed as a result of the fastening of the fan device.

A fan device is proposed for achieving the above-mentioned object. The fan device includes at least one locking element for fastening the fan device on a wall portion which comprises a front side and a rear side, in particular on a wall of a switching cabinet. The fan device is distinguished in that the fan device is realized for the purpose of being inserted in a pressure-less manner into a front-side opening in the wall portion and that, in the inserted state, the locking element is displaceable in the direction of the rear side of the wall portion. To this end, the at least one locking element is preferably mounted so as to be movable on the fan device and is displaceable manually from a mounting position into a fixing position, in which it cooperates with the rear side of the wall portion, for fastening the fan device on the wall portion.

An essential point of the invention is consequently that no considerable overpressure has to be exerted onto the fan device during fastening in order to latch the fan device with the wall of the switching cabinet. Quite the opposite, the present invention enables the fan device to be positioned in an opening of the wall portion without any resistance. The fan device, therefore, is certainly also inserted into a corresponding recess in the wall, the insertion, however, is advantageously effected without pressure. The fixing of the fan device is effected as a result of pressure being exerted at points onto the rear side of the wall portion as a result of the manual actuation of the locking element, which is mounted, preferably movably, on the fan device for this purpose. Corresponding fixing, in particular locking or latching the fan device on the wall portion, can be effected, for example, on account of a rotating or pulling movement. As a result of said movement, the locking element is pressed or pulled from behind, i.e. from the interior of the switching cabinet onto the rear-side wall of the switching cabinet. A targeted connection at points between the fan device and a wall of the switching cabinet is produced in this manner without there being the risk of the wall of the switching cabinet bending on account of pressure being exerted whilst the fan device is inserted into the opening in the wall portion.

Particularly preferred is a fan device where the locking element engages behind the wall portion at least in the fixing position. In the case of this type of embodiment of the invention, over and above this, the locking element, in the mounting position, can allow the insertion of the fan device into a corresponding opening in a wall portion, whilst locking, i.e. a fixed connection between the fan device and the wall portion, is not effected until displacement into the fixing position. The pressure exerted onto the wall portion is consequently reduced at points onto the regions of the locking elements, the pressure, however, not being exerted from the front, but from the rear, i.e. from the interior of the switching cabinet onto the wall portion. The wall portion deforming is avoided as a result.

It is preferably provided that the at least one locking element reaches through a housing of the fan device and is displaceable relative thereto. The locking element is able to be displaced simply from a mounting position into a fixing position in this way. A locking element is preferably arranged in each case in an inner edge region of the fan device and in particular in at least two corner regions of a fan carrier. It can also be provided that a locking element is arranged in each case in each of the four corner regions of the fan carrier. As an alternative to this, a locking element can also be arranged in a side region of a fan carrier, i.e. in a region therefore between two corner regions.

The locking element is preferably realized such that it is steplessly adaptable to different wall thicknesses for fastening the fan device. This means that the locking element is preferably realized without steps and can consequently be used in conjunction with all customary wall thicknesses. In the case of an alternative embodiment of the invention, it can be provided that the locking element is able to assume several latching positions for fastening the fan device onto variously thick wall portions. The latching positions are then preferably matched to the most usual wall thicknesses, in particular those of switching cabinets.

The locking element can for example be realized as a rotating locking bar which is mounted on the fan device so as to be rotatable. As an alternative to this, the locking element can be realized as a tongue which has a tensioning hook fastened thereon, the tongue together with the tensioning hook being displaceable in a straight line in opposition to a mounting direction of the fan device. In order to determine the direction of movement of the locking element, it is possible to provide a guide device which avoids the locking element being displaced manually in an incorrect manner.

A locking element is also proposed for achieving the above-mentioned object. The locking element serves for fastening a fan device on a wall portion, in particular on a wall of a switching cabinet. The locking element is preferably realized for the purpose of being mounted, in particular clamped-on, by way of a first portion on a wall portion, and by way of a second portion on a fan device.

The locking element serves for fastening a fan device on a wall portion, in particular on a wall of a switching cabinet. The locking element is preferably realized for the purpose of being mounted, in particular clamped-on, by way of a first portion on a wall portion and by way of a second portion on a fan device.

Also in the case of said embodiment of the invention, it is particularly advantageous that excessive pressure applied on the fan device and on the wall portion to be connected thereto is avoided. Fastening of the fan device on a wall portion is rather effected by means of separately realized locking elements which are clamped or clipped on both the wall portion and the fan device.

The first portion of the locking element preferably comprises a receiving region for receiving the wall portion. In order to be able to receive variously thick wall portions, the receiving region of the first portion is preferably realized so as to be expandable.

In particular, the receiving region can be realized in a resilient manner in the form of a spring element such that the locking element is able to be used universally for variously thick wall portions.

In order to bring about a fastening of the locking element on a fan device, the second portion preferably comprises a tensioning spring element or is realized as such. As a result of the tensioning spring element, a clamping connection between the locking element and the fan device can be accomplished. It is preferably provided that the first portion and the second portion mutually form substantially a right-angle.

The locking element according to the invention can form part of a fan device, the fan device comprising at least one opening for receiving the second portion of the locking element. An advantageous clamping connection between the fan device and the locking element and consequently between the fan device and the wall portion can be accomplished in this manner.

BRIEF DESCRIPTION OF THE INVENTION

The invention is explained in more detail below by way of the drawing, in which.

DETAILED DESCRIPTION OF THE INVENTION

Figure 1:
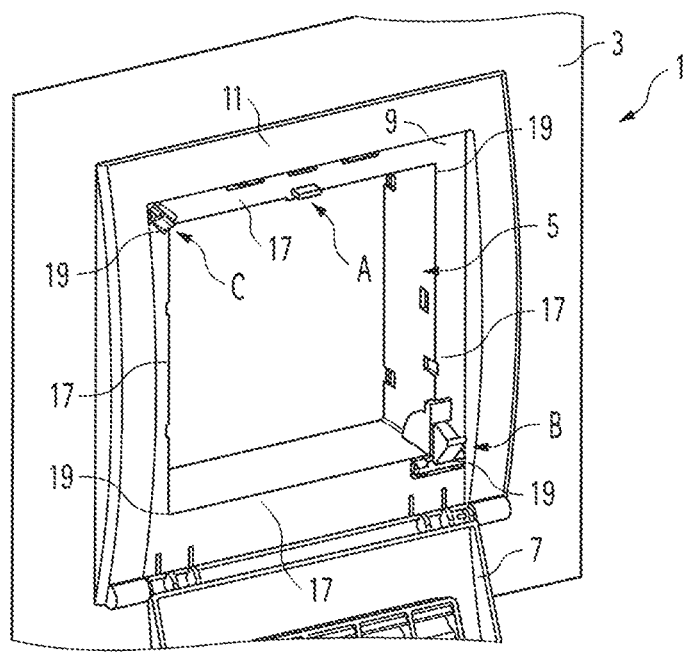
FIG. 1 shows a perspective representation of a fan device with three different locking elements according to the present invention.

FIG. 1 shows a fan device 1 which is mounted on a wall portion 3, the wall portion 3 possibly being, for example, a wall of a switching cabinet. The fan device 1 includes a fan carrier 5 which serves for receiving a fan which is not shown in the figure. With the fan device 1 mounted in a switching cabinet as shown in FIG. 1, the fan is consequently arranged inside the switching cabinet.

In order to avoid dust entering the switching cabinet by means of the fan device 1, the fan device 1 is preferably provided with a dust cover 7 which is shown in an open state in FIG. 1. The dust cover 7 can serve for receiving a filter mat or another filter element and, with the fan device 1 in the ready-to-operate state, is arranged in the region of a step 9 of the fan carrier 5. The step 9 consequently forms a recess for receiving the dust cover 7 and is surrounded by a frame 11 of the fan carrier 5 which is supported against the wall portion 3 by way of its rear side.

In the representation according to FIG. 1, the fan device 1 is provided with three different locking elements A, B and C according to the present invention as an example which are shown here in one single fan device 1 just for the purposes of comparison.

Figure 2:
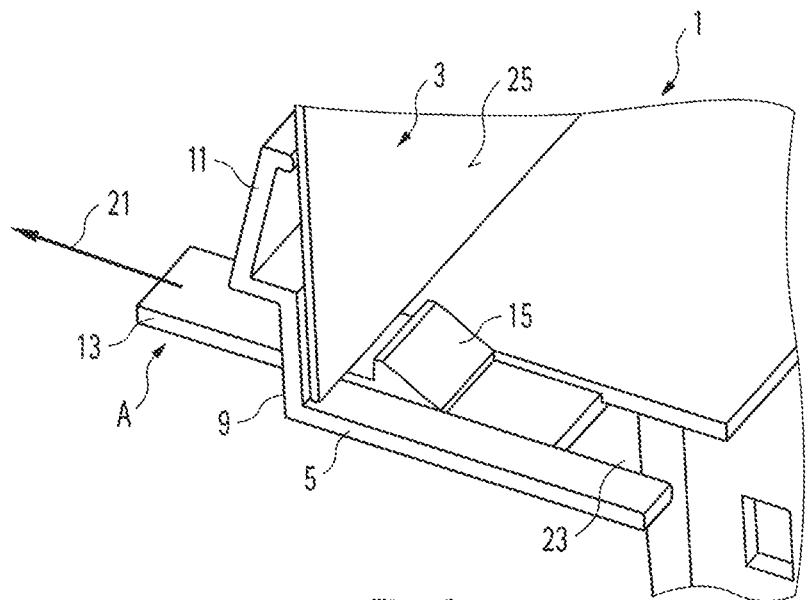
FIG. 2 shows a view of a detail of a locking element according to a first embodiment of the invention.

FIG. 2 shows a representation of a detail of a first embodiment of the invention where the locking element A is realized as a tongue 13 with a tensioning hook 15 mounted thereon. The locking element A reaches through the step 9 of the fan carrier 5 and is consequently arranged in an inner edge region of the fan device 1 or of the fan carrier 5.

As can be seen from FIG. 1, the locking element A is arranged in a side region 17 of the step 9 which extends between two corner regions 19 of the fan carrier 5.

As FIG. 2 makes clear, the locking element A is displaceable relative to the fan carrier 5 in opposition to a mounting direction, namely in the direction of the arrow 21. In other words, the locking element A is displaceable in opposition to the direction in which the fan device 1 is inserted into a corresponding recess of the wall portion 3. The movement direction 21 of the locking element A is determined by a guide device 3 which is provided in the form of a recess in the fan carrier 5 and in which the locking element A is able to move in a sliding manner. The movement direction 21 of the locking element extends, in this case, substantially perpendicularly to the plane of the wall portion 3.

The mounting and the fastening of the fan device 1 on the wall portion 3 is effected in the case of said embodiment of the invention in such a manner that the fan device 1 is inserted into a corresponding recess of the wall portion 3. In this connection, the locking element A is situated in a mounting position such that the insertion of the fan device 1 into the recess of the wall portion is not obstructed. As a result, the locking element A or the tongue 13 is pulled in the movement direction 21 such that the tensioning hook 15 moves toward the inside surface 25 of the wall portion 3. The pull on the tongue 13 is effected until the tensioning hook 15 abuts against the inside surface 25 of the wall portion 3 and consequently has reached its fixing position. As a result of the locking element A being displaceable in the mounting direction 25, it is able to be used for arbitrary wall thicknesses.

The tensioning hook is realized in particular in a wedge-shaped manner and is pulled against the inside surface 25 of the wall portion 3 in such a manner that a pressing pressure is generated between the fan device 1 and the wall portion 3. A locking of the locking element A is preferably effected by corresponding latching elements which can be mounted, for example, between the guide device 23 and the tongue 13. However, a different locking mechanism which prevents a more extensive relative displacement between the locking element A and the fan device 1 or the fan carrier 5 is basically also conceivable.

In FIG. 1, the fan device 1 includes just one locking element A. However, it is basically also conceivable for more than one and in particular each of the side regions 17 to be provided with a locking element A.

Figure 3:
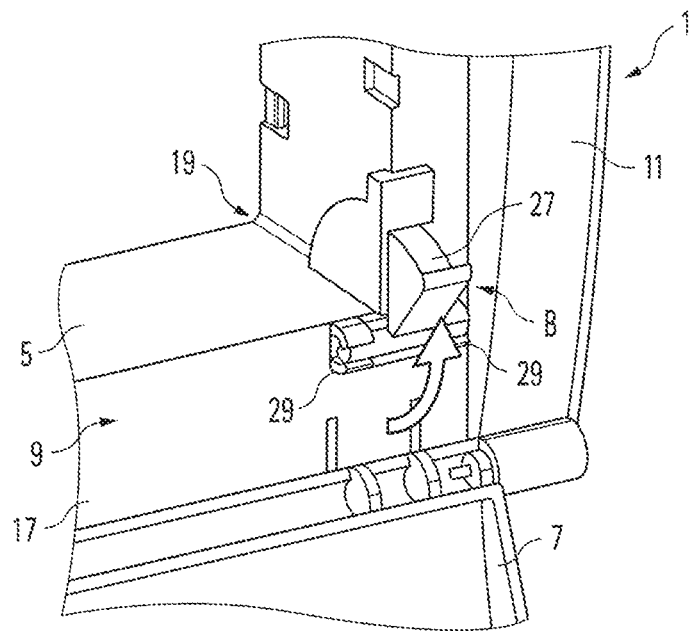
FIG. 3 shows a view of a detail of a locking element according to a second embodiment of the invention.
Figure 4:
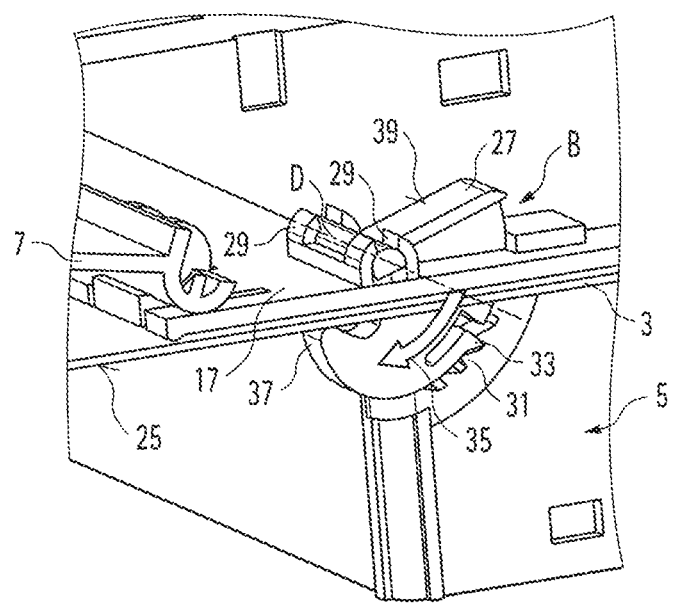
FIG. 4 shows a view of a detail of the locking element according to the second embodiment of the invention in the fixing position.

FIGS. 3 and 4 show a representation of a detail of a locking element B according to the second embodiment of the invention. In said embodiment the locking element B is realized as a rotating locking bar 27 which is mounted by means of a bearing 29 so as to be rotatable on the fan device 1 and in particular on the fan carrier 5. The rotational axis D of the rotating locking bar 27 is arranged substantially parallel to a wall portion 3 when the fan device 1 communicates with said wall portion 3. As shown in FIG. 3 and in particular also FIG. 4, the rotating locking bar 27 reaches through the housing and in particular reaches through the step 9 in a corner region 19 of the fan carrier 5. The inside surface of the step 9 additionally forms the support surface for the wall portion 3 which, in the fixed state, is arranged between the closed rotating locking bar 27 and the support surface.

The rotating locking bar 27 is realized in a substantially part-circle-shaped or hook-shaped manner and interacts with latching steps 31 which are integrated in the fan carrier 5 and in which a latching lug 33, which is provided on the rotating locking bar 27, is able to engage when the rotating locking bar 27 is displaced in the direction of rotation 35. The direction of rotation 35 is substantially perpendicular to a plane of the wall portion 3 with the fan device 1 in a mounted state. The latching steps 31 are arranged along the movement direction of the rotating locking bar 27. The further the rotating locking bar 27 is rotated in the direction of rotation 35, the closer a distal end 37 of the rotating locking bar 27 moves to an inside surface 25 of the wall portion 3. The rotating locking bar 27 is rotated in the direction of rotation 35 and the latching lug 33 consequently latches in consecutive latching steps 31 until the distal end 37 of the rotating locking bar 27 knocks against the inside surface 25 of the wall portion 3. As a result of the latching lug 33 latching in the latching steps 31 of the fan carrier 5, it is no longer possible for the rotating locking bar 27 to be released from the fixing position (see FIG. 4).

The fan device 1 is fastened on a wall portion 3 by way of the locking element B according to the second embodiment of the invention therefore as follows:

First of all, the fan device 1 is inserted into a corresponding recess in the wall portion 3, the cut-out in the wall portion 3 being adapted to the contour and the size of the fan device 1 or in particular to the dimensions of the fan carrier 5. In this connection, the locking element is situated in a mounting position in which the insertion of the fan device into the recess of the wall portion is not obstructed. Once the fan carrier 5 has been inserted into the recess of the wall portion 3, the rotating locking bar 27 is actuated manually by a user exerting a force onto a pressure surface 39 such that the rotating locking bar 27 is displaced around its rotational axis D in the direction of rotation 35. The locking lug 33, in this connection, gradually latches into the latching steps 31 integrated in the fan carrier 5 until the distal end 37 knocks against the inside surface 25 of the wall portion 3 and consequently assumes its fixed position.

The number and the characteristics of the latching steps in combination with the latching lug 33 are preferably matched to different wall thicknesses. Each latching step 31 consequently enables a wall portion 3 with a different thickness to be received. Only four latching steps 31 are shown in the present example. However, it is obvious that it is also possible to provide a finer grid system which allows for a wider spectrum of wall thicknesses and is consequently usable in an even more flexible manner.

FIG. 1 shows one single locking element B just in a corner region 19 of the fan carrier 5. However, it is obvious that a locking element B can be mounted in each case preferably in at least two, in particular in each of the four corners 19 of the fan carrier 5 for fastening the fan device 1 on a wall portion 3 in a more reliable manner.

Each of the locking elements B has to be manually actuated when the fan device 1 is fastened on the wall portion 3 in order to engage the rotating locking bar 27 behind the wall portion 3. As is made particularly clear in FIG. 4, it is also ensured in the case of said embodiment that pressure is only exerted onto the wall portion 3 at points and, over and above this, is not effected from the front but from the rear, i.e. acts on the inside surface 25 of the wall portion 3. This consequently rules out the wall portion bending.

The locking element B can be opened, in principle, from the inside surface of the wall portion, for example by means of a screwdriver. In addition, the pressure surface 39 can be provided with a fluting such that the pressure is also able to be exerted by way of a tool, for example by way of a screwdriver.

Figure 5:
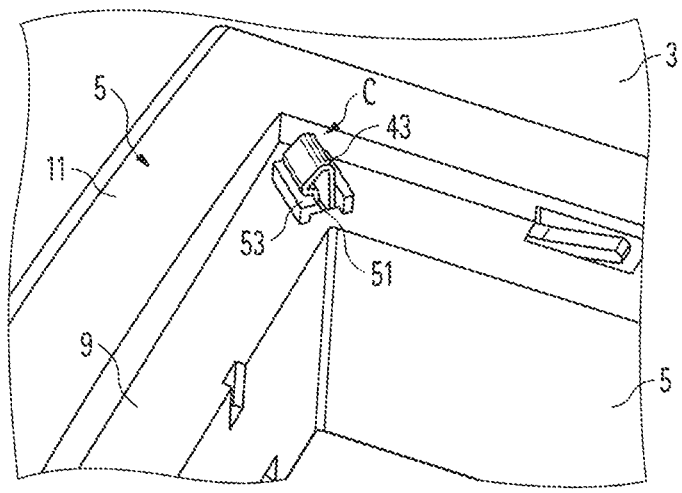
FIG. 5 shows a view of a detail of a locking element according to a third embodiment of the invention in a locking position.
Figure 6:
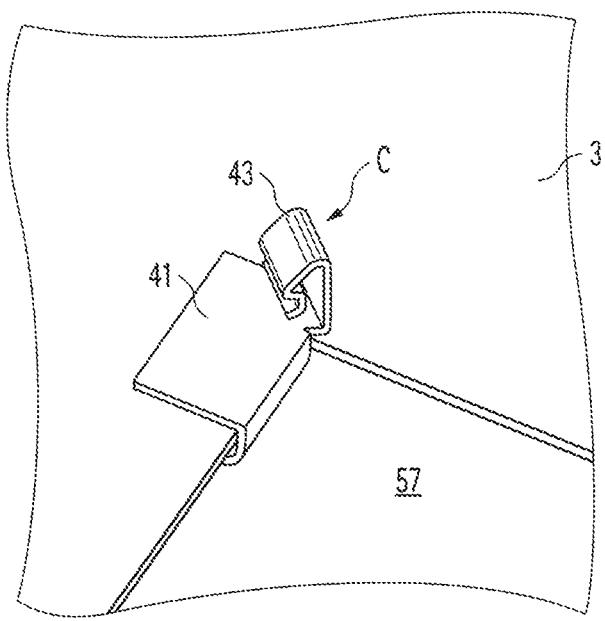
FIG. 6 shows a view of a detail of the locking element according to the third embodiment of the invention.
Figure 7:
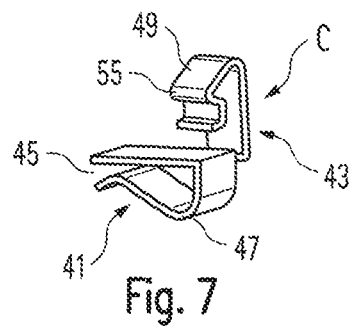
FIG. 7 shows a perspective representation of a locking element according to the third embodiment of the invention.

FIGS. 5 to 7 show yet another embodiment of the invention where a locking element C is realized completely separately from the fan device 1 and the wall portion 3. The locking element C includes a first portion 41 and a second portion 43, both of which are arranged substantially at right-angles to one another. The first portion 41 comprises a spring arm 47 in such a manner that the receiving region 45 is realized so as to be expandable for receiving wall portions of various thicknesses. The resilient spring arm 47 provides for a fixed clamping connection between the locking element C and the wall portion 3 for each wall thickness. The first portion is realized in other words in a substantially U-shaped or clamp-like manner and in this way encompasses a wall portion 3 such that the first portion 41 abuts against both sides of a wall portion 3.

The second portion 43 includes a tensioning spring element 49 which is provided to be received in a recess 51 of a fan carrier 5 in order to engage there in a clamping or latching manner with at least one projection 53. The tensioning spring element 49 is realized in a resilient manner such that a spring arm 55 is displaceable when the tensioning spring element 49 is guided through the opening 51 in the fan carrier 5 and once it has passed through the opening 51 is expanded again and engages with the projection 53. In this way, the tensioning spring element 49 or the spring arm 55 prevents the second portion 43 being able to be released again from the fan device 1 through the opening 51.

A fan device 1 is consequently fastened on a wall portion 3 by way of the locking element C in all as follows:

First of all, as shown in FIG. 6, the locking element C is connected to a wall portion 3, in particular in a corner region of a corresponding recess 57 for receiving the fan device 1. Definitively speaking, the wall portion 3 is guided into the receiving region 45 of the first portion 41. In said position, the second portion 43 stands out substantially at an angle of 90° from the surface of the wall portion 3. The fan device 1 is then inserted into the recess 57 of the wall portion 3. During said operation, as a result of exerting a certain pressure onto the corner regions 19 of the fan carrier 5, the tensioning spring element 49 of the locking element C is pressed through the opening 51 of the fan carrier 5 until the spring arm 55 has run through the recess 51 and in the end position (fixing position) snaps apart in order to engage with the projection 53. It is no longer possible in said fixing position of the locking element C to release the fan device 1 from the wall portion 3. It is obvious that the positioning of the locking elements C and the (passage) openings 51 in the fan carrier 5 have to be matched to one another in a positionally accurate manner.

In FIG. 1 the fan device 1 comprises just one locking element C in a corner region 19 of the fan carrier 5. However, it is obvious that preferably one locking element C is provided in at least two and preferably in all four corner regions 19 of the fan device 1 in order to ensure the fan device 1 is locked in a reliable manner on the wall portion 3.

All in all, the present invention creates an advantageous fan device and advantageous locking elements which, unlike the conventional locking mechanisms, do not require excessive pressure to be exerted on the fan device to generate latching. Rather, the locking elements engage behind in such a manner that, in its fixing position, the locking element engages with the inside surface 25 of the wall portion 3, pressure being exerted exclusively onto the locking element and not onto the front side of the wall portion 3. In this way, the fan device 1 is fastened gently on the wall portion 3 and any deformation of a wall portion 3 is avoided.

LIST OF REFERENCES

1 Fan device
3 Wall portion
5 Fan carrier
7 Dust cover
9 Step
11 Frame
13 Tongue
15 Tensioning hook
17 Side region
19 Corner region
21 Mounting direction
23 Guide device
25 Inside surface
27 Rotating locking bar
29 Bearing
31 Latching steps
33 Latching lug
35 Direction of rotation
37 Distal end
39 Pressure surface
41 First portion
43 Second portion
45 Receiving region
47 Spring arm
49 Tensioning spring element
51 Opening
53 Projection
55 Spring arm
57 Recess
A Locking element
B Locking element
C Locking element
D Rotational axis

The invention claimed is:

1. A fan device for being inserted without pressure in an opening of a wall, the wall having a wall front side and a wall rear side, the opening connecting the wall front side and the wall rear side, the fan device comprising:

a fan front side proximal to the wall front side;
a locking element for fastening the fan device in the opening of the wall,
wherein the locking element displaces in a mounting direction from the wall front side to the wall rear side;
wherein the locking element is mounted to be actuatable from the fan front side; and
wherein the locking element comprises a rotatable locking bar, the rotating locking bar is part-circle-shaped and comprises a latching lug for engaging with latching steps integrated in a fan carrier;
wherein the rotating locking bar comprises an actuating pressure surface onto which a force is manually exertable by a user to enable a distal end of the rotating locking bar to abut on the wall.

2. The fan device of claim 1,
wherein the locking element comprises a plurality of latching positions for locking the fan device to a plurality of thicknesses of the wall.

3. The fan device of claim 1,
further comprising a housing;
wherein the locking bar rotates relative to the housing to fasten the fan device to the wall.

4. The fan device of claim 1,
further comprising a housing;
wherein the locking element is movable to the housing and is manually displaceable from a mounting position into a fixing position, the locking element being in the fixing position when the fan device is fixed onto the wall, the locking device being in the mounting position when the fan device is inserted in the opening of the wall.

5. The fan device of claim 4,
wherein in the fixing position the locking element abuts the rear side of the wall.

6. The fan device of claim 1,
further comprising a housing;
wherein the locking element is disposed through the housing, the locking element being displaceable relative to the housing.

7. The fan device of claim 1,
wherein the locking element is disposed in an inner edge region of the fan device.

8. The fan device of claim 1,
wherein the locking element is disposed in a side region of the fan carrier.

9. The fan device of claim 1,
wherein the locking element is stepless for locking the fan device to a plurality of thicknesses of the wall.

10. The fan device of claim 1,
further comprising a fan carrier;
wherein the locking element is disposed in at least a corner of the fan carrier.

11. A fan device for mounting in an opening of a wall, the wall having a wall front side and a wall rear side, the opening connecting the wall front side and the wall rear side, the fan device comprising:

a fan carrier comprising
a fan front side proximal to the wall front side when the fan device is mounted in the opening, and
a plurality of latching steps integrated in the fan carrier;
a locking element for preventing the fan device from dismounting from the opening, the locking element comprising
a user-initiated pressure surface actuatable from the fan front side, a rotatable locking bar having a part circle-shape, the pressure surface connected to the locking bar, and a latching lug for engaging with the plurality of latching steps, the latching lug formed on a side of the locking bar;

wherein the locking bar displaces in a direction of rotation from the wall front side to the wall rear side to abut a portion of the latching lug against the wall rear side to lockably mount the fan device in the opening.

12. The fan device of claim 11, wherein the portion of the latching lug abutting the wall rear side is a distal end of the latching lug.

13. The fan device of claim 11, wherein the direction of rotation is substantially perpendicular to a plane of the wall.

14. The fan device of claim 11, further comprising a housing;

wherein the locking element is disposed through the housing, the locking element being displaceable relative to the housing.

15. The fan device of claim 11, wherein the locking element is disposed in an inner edge region of the fan device.

16. The fan device of claim 11, wherein the locking element is disposed in a side region of the fan carrier.

17. The fan device of claim 11, wherein the side of the locking bar is formed on is arcuate.

\* \* \* \* \*